(12) United States Patent
Dudley

(10) Patent No.: US 6,389,702 B1
(45) Date of Patent: May 21, 2002

(54) METHOD AND APPARATUS FOR MOTION CONTROL

(75) Inventor: Tex M. Dudley, Palo Alto, CA (US)

(73) Assignee: Electroglas, Inc., San Jose, CA (US)

(*) Notice: Subject to any disclaimer, the term of this patent is extended or adjusted under 35 U.S.C. 154(b) by 0 days.

(21) Appl. No.: 09/569,775

(22) Filed: May 12, 2000

(51) Int. Cl.$^7$ .............................. G01B 5/25; G01B 7/31
(52) U.S. Cl. ......................................... 33/1 M; 33/645
(58) Field of Search ........................ 33/1 M, 613, 645; 310/12

(56) References Cited

U.S. PATENT DOCUMENTS

| | | | | |
|---|---|---|---|---|
| 4,575,942 A | * | 3/1986 | Moriyama | 33/1 M |
| 5,757,160 A | * | 5/1998 | Kreuzer | 33/1 M |
| 5,760,500 A | * | 6/1998 | Kondo et al. | 310/12 |
| 6,005,309 A | * | 12/1999 | Chitayat | 310/12 |
| 6,082,010 A | * | 7/2000 | Lee | 33/1 M |

* cited by examiner

*Primary Examiner*—G. Bradley Bennett
(74) *Attorney, Agent, or Firm*—Blakely, Sokoloff, Taylor & Zafman LLP

(57) ABSTRACT

An apparatus and method for positioning a wafer holding platform by moving it along a first set of axes concurrently through a path measured along a second set of axes. An apparatus of the present invention comprises a motor system to move the wafer holding stage and a motion control system to control the path of the wafer holding stage. The motor system constrains the wafer holding stage to a first two axes of movement, and the motion control system controls the path along a second two axes of movement. The first two axes and second two axes are located at angles from one another. The distance a wafer on the wafer holding stage is to be moved is measured along the second two axes. A method comprises constraining the movement of a wafer holding stage to a first and a second movement axes and controlling a path of the wafer holding stage along a third and a fourth movement axis. The present invention increases the speed of the wafer holding platform, thereby decreasing the time needed to test a wafer.

29 Claims, 9 Drawing Sheets

METHOD AND APPARATUS FOR MOTION CONTROL

BACKGROUND OF THE INVENTION

1. Field of the Invention

The present invention relates generally to positioning systems and methods, and more specifically to positioning systems and methods which control the movement of a substrate such as a semiconductor wafer which includes numerous integrated circuits located on the substrate.

2. Background Information

Positioning systems are used in different areas of semiconductor fabrication. For example, wafer probers, photolithographic systems and other semiconductor integrated circuit fabrication devices often use a wafer positioning system. Most wafer positioning systems are based on combinations of linear motions of one or more stages along orthogonal directions. An example of a conventional linear motion wafer positioning system in a wafer prober will now be described with reference to FIGS. 1 and 2.

A semiconductor wafer usually includes numerous integrated circuits arranged in a grid pattern. Located on each integrated circuit (IC) is a plurality of bonding pads that are used to connect the IC to external circuitry to allow the IC to function. Because the packaging of each IC is rather expensive, it is desirable to test each IC before packaging to avoid packaging defective IC's. This process of testing devices before packaging is called the sort process, and it also involves connecting a probe card to a special tester. FIG. 1 depicts a prior art wafer prober system 10 that includes a basic example of a probe card 16 mounted on a support 15. Probe card 16 includes a number of pins 17 that act as substitutes for the normal pins and wire leads of a package device. Pins 17 are made to come into electrical contact with the bonding pads 13 of at least one integrated circuit on a semiconductor wafer 12 that rests on a wafer chuck 11, which is also called a wafer holding platform. Wafer prober system 10 positions each IC on the wafer with respect to probe card 16 so that the appropriate pins 17 on probe card 16 contact the appropriate bonding pads 13 for a particular IC on semiconductor wafer 12.

As the art of semiconductor processing advances, semiconductor wafers become larger, die geometries become smaller, the number of pads on each die increases, and the size of each pad decreases. Thus, the alignment accuracy and speed requirements for a wafer prober become more stringent, placing great demands on the positioning stages used in a wafer prober. The positioning stages are aided by modern vision systems that use cameras, such as cameras 14 and 19 that are designed to view probe card 16 and semiconductor wafer 12, respectively, to attempt to accurately align an IC on a semiconductor wafer with respect to the pins on a probe card.

FIG. 2 depicts a conventional prior art wafer positioning system that can be used in a wafer prober or other semiconductor fabrication device. When used in wafer probers, positioning systems must provide four axes (X,Y,Z,θ) of motion. A common implementation includes an X,Y stage for positioning in X,Y and an independent Z to stage and an independent θ stage. FIG. 2 shows a wafer positioning system 20 using a conventional rectilinear X,Y stage. A wafer chuck 25 is positioned on top of a Y-motion stage 21 which moves along guide rails 22a and 22b to provide translation in the Y axis. Wafer chuck 25 may include a rotary motor located on top of Y motion stage 21 and below wafer chuck 25 to provide θ motion for wafer chuck 25. An X-motion stage 23 moves along guide rails 24a and 24b to provide translation in the X axis. A semiconductor wafer 30 is positioned on top of wafer chuck 25 and is typically held in place by a vacuum generated under the surface of the semiconductor wafer by the wafer chuck. A separate Z stage (not shown) provides translation in the Z axis by either changing the distance between wafer chuck 25 and Y-motion stage 21 or by moving both X-motion stage 23 and Y-motion stage 21 along with their corresponding guide rails in the Z axis.

FIG. 3A shows a side view of a simplified representation of a prior art wafer positioning system that uses linear motors, such as Sawyer motors. A wafer holding stage 40 comprises electromagnetic assemblies 37 bonded to each other by a permanent magnet 38; the coupling of two electromagnetic assemblies and a permanent magnet forms a motor. The motor is bonded to a material layer 39. Wafer holding stage 40 is located above and separated from a platform 35 by a thin air gap 36.

A limitation of prior art wafer positioning systems that are based on 82 combinations of linear motions along orthogonal directions is that the wafer is moved on along only one direction by one set of motors or one stage. For example, with reference to FIG. 2, semiconductor wafer 30 is moved in the X direction by only X-motion stage 23, and it is moved in the Y direction by only Y-motion stage 21. Thus, at any time the wafer is being moved, one stage is left unused. As speed requirements for wafer positioning systems increase, it is desirable to provide a wafer positioning system that utilizes multiple avenues of movement concurrently and works within current physical constraints of wafer positioning systems.

SUMMARY OF THE INVENTION

The present invention provides a wafer positioning system which includes in one embodiment a motor system to move a wafer holding stage and a motion control system to control a path of the wafer holding stage. The motor system constrains the wafer holding stage to a first set of two movement axes, which are the physical axes, and the motion control system controls the path of the wafer holding stage along a second set of two movement axes, which are the non-physical axes. The first set of movement axes comprise axes at an angle to each other, and the second set of movement axes also comprise axes at an angle to each other. The first and second sets of axes are also located at an angle to each other. The distance a wafer on the wafer holding stage is to be moved is measured along one of the non-physical axes. To move the wafer along this distance, the motion control system moves the wafer holding stage along the physical axes of the motor system concurrently.

The present invention also provides a method for moving a wafer holding stage in a wafer positioning system. In one example of this method, the movement of the wafer holding stage is constrained to a first and a second axis, and the path of the wafer holding stage is controlled along a third and a fourth axis. In another example of this method, the step of controlling the path of the wafer holding stage includes the steps of measuring along the third or fourth axes the distance a wafer is to be moved and moving the wafer holding stage along the first and second axes concurrently.

Additional features and benefits of the present invention will become apparent upon review of the following description.

BRIEF DESCRIPTION OF THE DRAWINGS

The various embodiments of the present invention will be described in detail with reference to the following drawings in which like reference numerals refer to like elements. It will be appreciated that the present invention is illustrated by way of example and not limitation in the accompanying figures.

DETAILED DESCRIPTION

The following description provides examples of the present invention. However, it will be appreciated that other examples of the present invention will become apparent to those of ordinary skill in the art upon examination of this description. Thus, the present description and accompanying drawings are for purposes of illustration and are not to be used to construe the invention in a restrictive manner.

Most wafer positioning systems are based on combinations of linear motions along orthogonal directions. However, these wafer positioning systems are limited by the fact that they move the wafer along only one direction using only one set of motors or one stage. Thus, at any time the wafer is being moved in most conventional wafer positioning systems, at least one set of motors or one stage is idle. By using multiple motors or stages concurrently to move the wafer, a wafer positioning system can take advantage of its previously idle motors or stages and increase its speed performance.

Figure 4A:
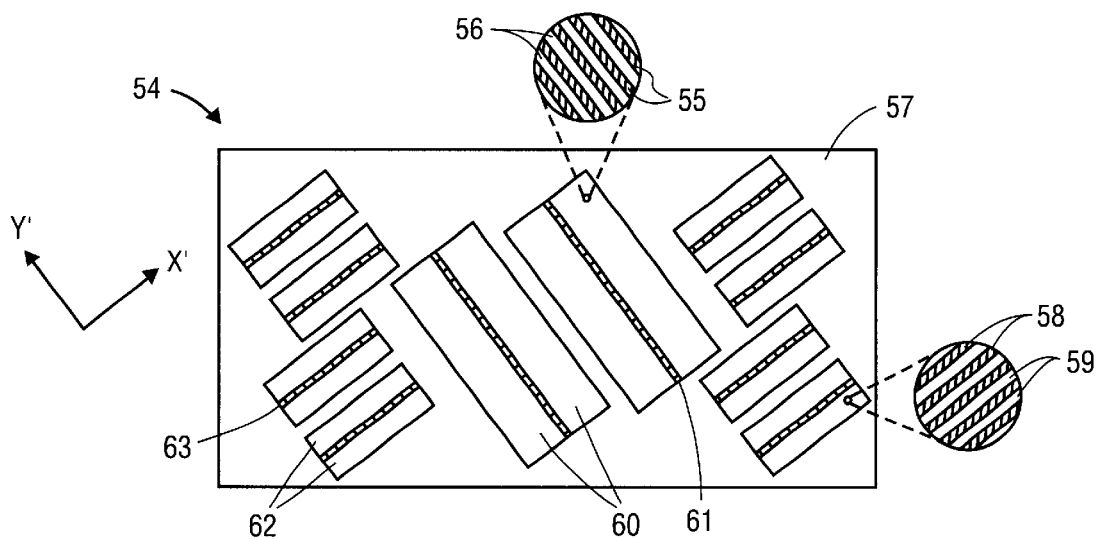
FIG. 4A is a bottom view of a wafer holding stage used in one embodiment of a wafer positioning system in accordance with the teachings of the present invention.

FIG. 4A shows a bottom view of a wafer holding stage 54 powered by a motor system comprising linear motors according to one embodiment of the present invention. The linear motors on wafer holding stage 54 comprise outboard motors and inboard motors bonded to a material layer 57, which can be made of aluminum. Each outboard motor comprises a pair of electromagnetic assemblies 62 coupled to each other by a permanent magnet 63. Electromagnetic assemblies 62 have alternating positioning teeth 58 and grooves 59 aligned with a first movement axis (X'). Each inboard motor also comprises a pair of electromagnetic assemblies 60 coupled to each other by a permanent magnet 61. Electromagnetic assemblies 60 have alternating positioning teeth 55 and grooves 56 aligned with a second movement axis (Y'). The first and second movement axes are orthogonal to each other, and they form the physical axes to which the inboard and outboard motors constrain wafer holding stage 54. In one embodiment, grooves 56 and 59 are filled with epoxy (not shown) to make the surface of the inboard and outboard motors substantially flat.

Figure 4B:
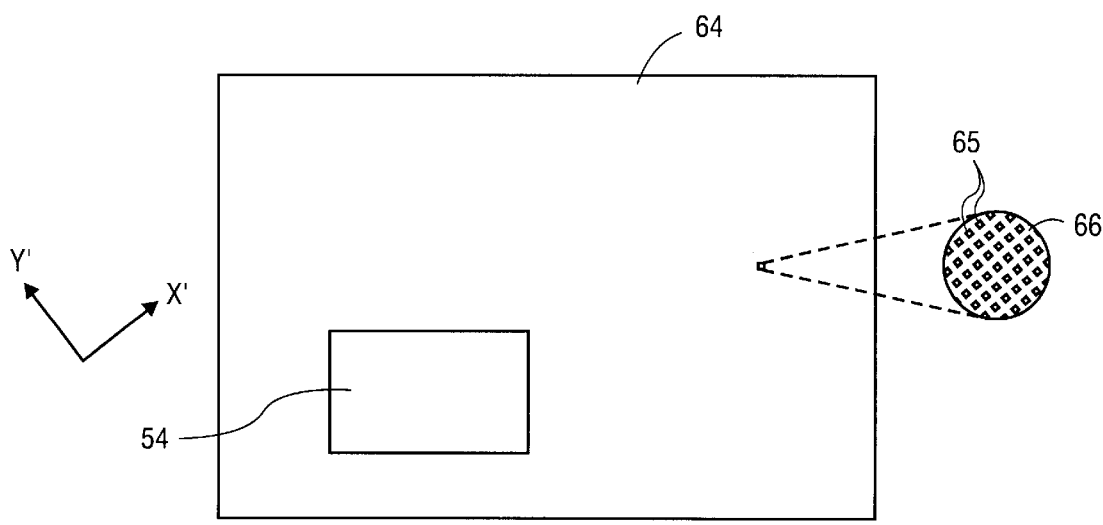
FIG. 4B is a top view of one embodiment of a wafer positioning system that can use the wafer holding stage shown in FIG. 4A.

FIG. 4B is a top view of one embodiment of a wafer positioning system that can use wafer holding stage 54. Wafer holding stage 54 is located above a platform 64 that has positioning teeth 65 arranged in a waffle pattern and separated from one another by orthogonally intersecting grooves 66. Wafer holding stage 54 and platform 64 are separated by a thin layer of air. In one embodiment, grooves 66 are filled with epoxy to make the surface of platform 64 substantially flat. The pitch, or center-to-center distance, between adjacent positioning teeth 65 as measured along X' or Y' is the same as the pitch between adjacent positioning teeth 55, as measured along X', and between adjacent positioning teeth 58, as measured along Y'. Positioning teeth 55 and 58 on wafer holding stage 54 can then match up with a line of positioning teeth an 65 on platform 64 along either X' or Y' as the flux of the permanent magnets of the inboard and outboard motors is diverted among the poles of the electromagnetic assemblies.

Figure 4C:
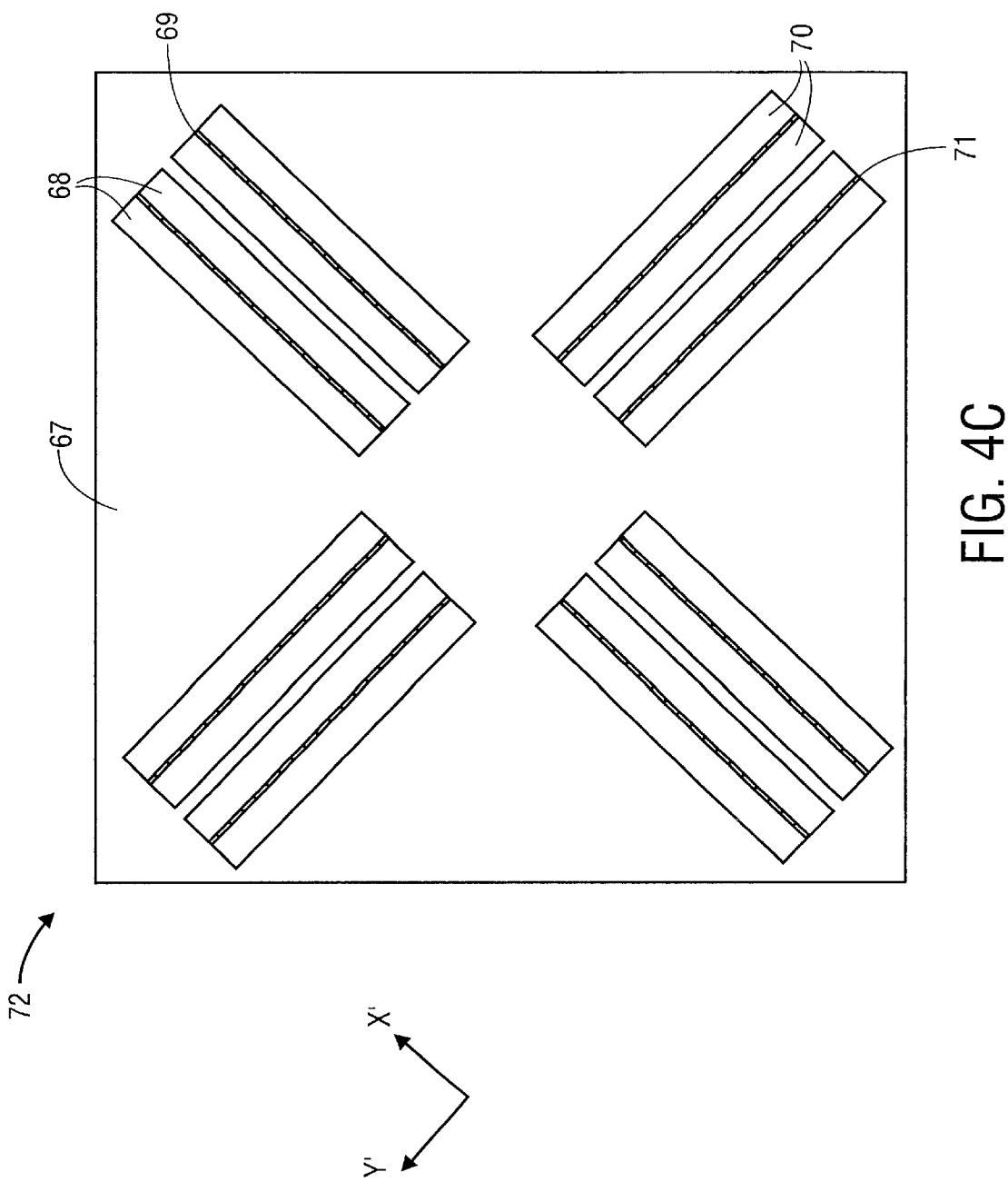
FIG. 4C is a bottom view of another wafer holding stage used in another embodiment of a wafer positioning system in accordance with the teachings of the air present invention.

FIG. 4C is a bottom view of another wafer holding stage 72 that can be used in another embodiment of a wafer positioning system in accordance with the teachings of the present invention. The linear motors of wafer holding stage 72 are bonded to a material layer 67, which can be made of aluminum. The linear motors comprising electromagnetic assemblies 68 bonded to each other by a permanent magnet 69 are aligned with the first movement axis (X'). The linear motors comprising electromagnetic assemblies 70 bonded to each other by a permanent magnet 71 are aligned with the second movement axis (Y'). Electromagnetic assemblies 68 and 70 also have positioning teeth and grooves similar to those of electromagnetic assemblies 62 and 60, respectively. Wafer holding stage 72 can be used with platform 64.

Figure 1:
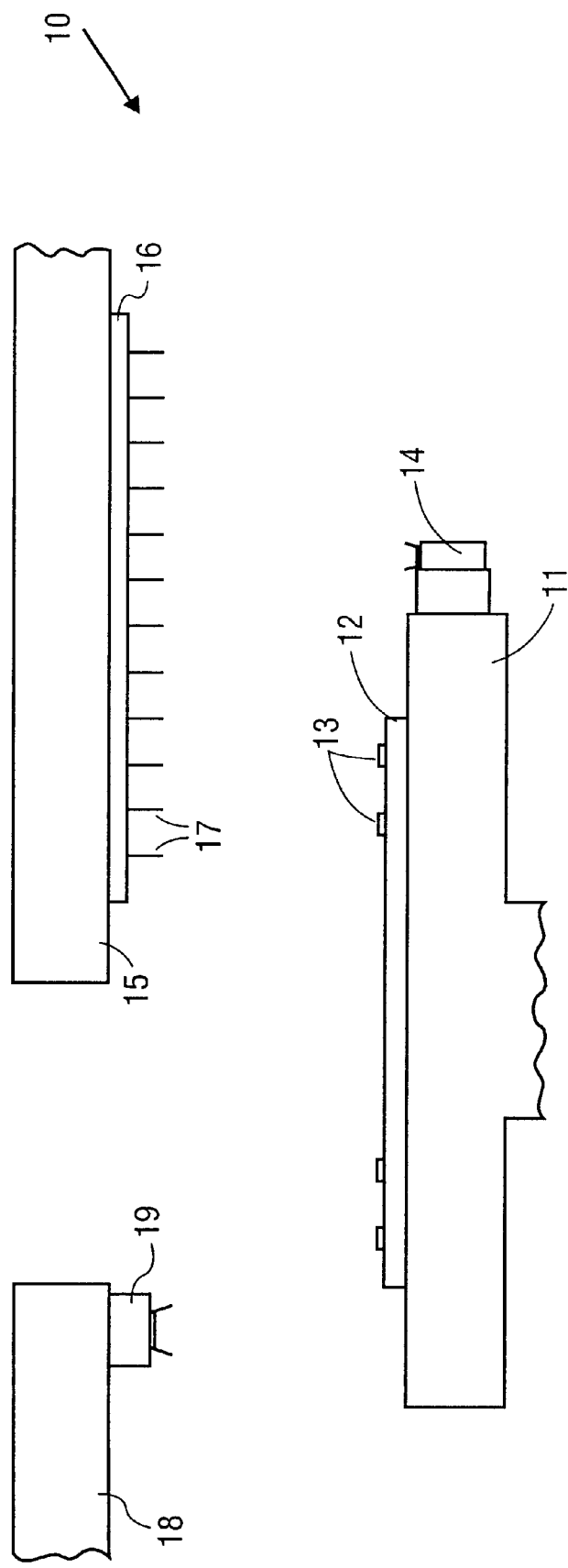
FIG. 1 is a side view of a prior art wafer probing system.
Figure 2:
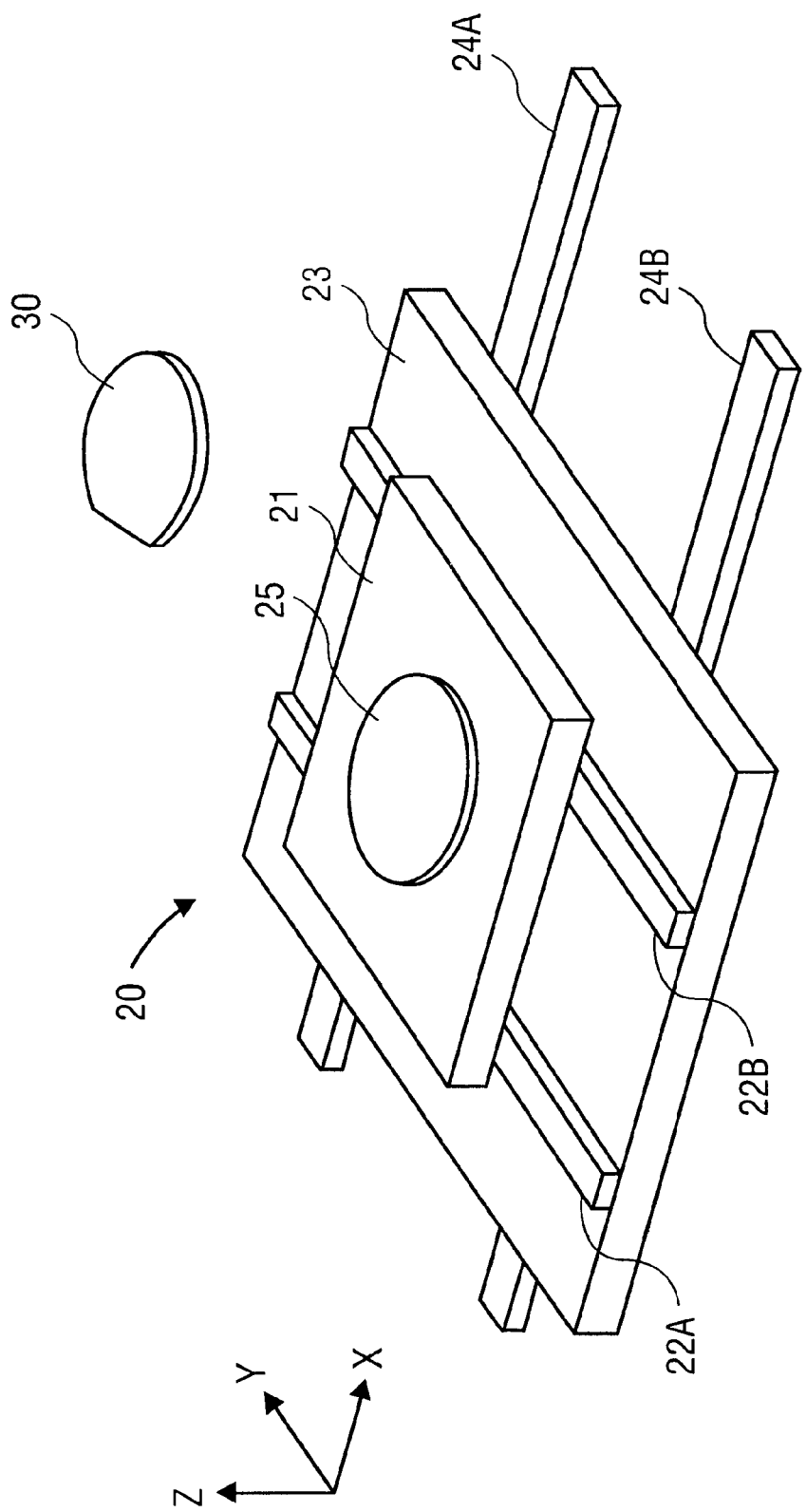
FIG. 2 is a perspective view of a prior art wafer positioning system.

Although the present invention has been described with particular reference to wafer positioning systems using linear motors, it is appreciated that the teachings of the present invention are applicable to other wafer positioning systems, such as the one shown in FIG. 2. Indeed, the teachings of the present invention are applicable to any positioning system that controls motion along at least two axes.

Figure 5:
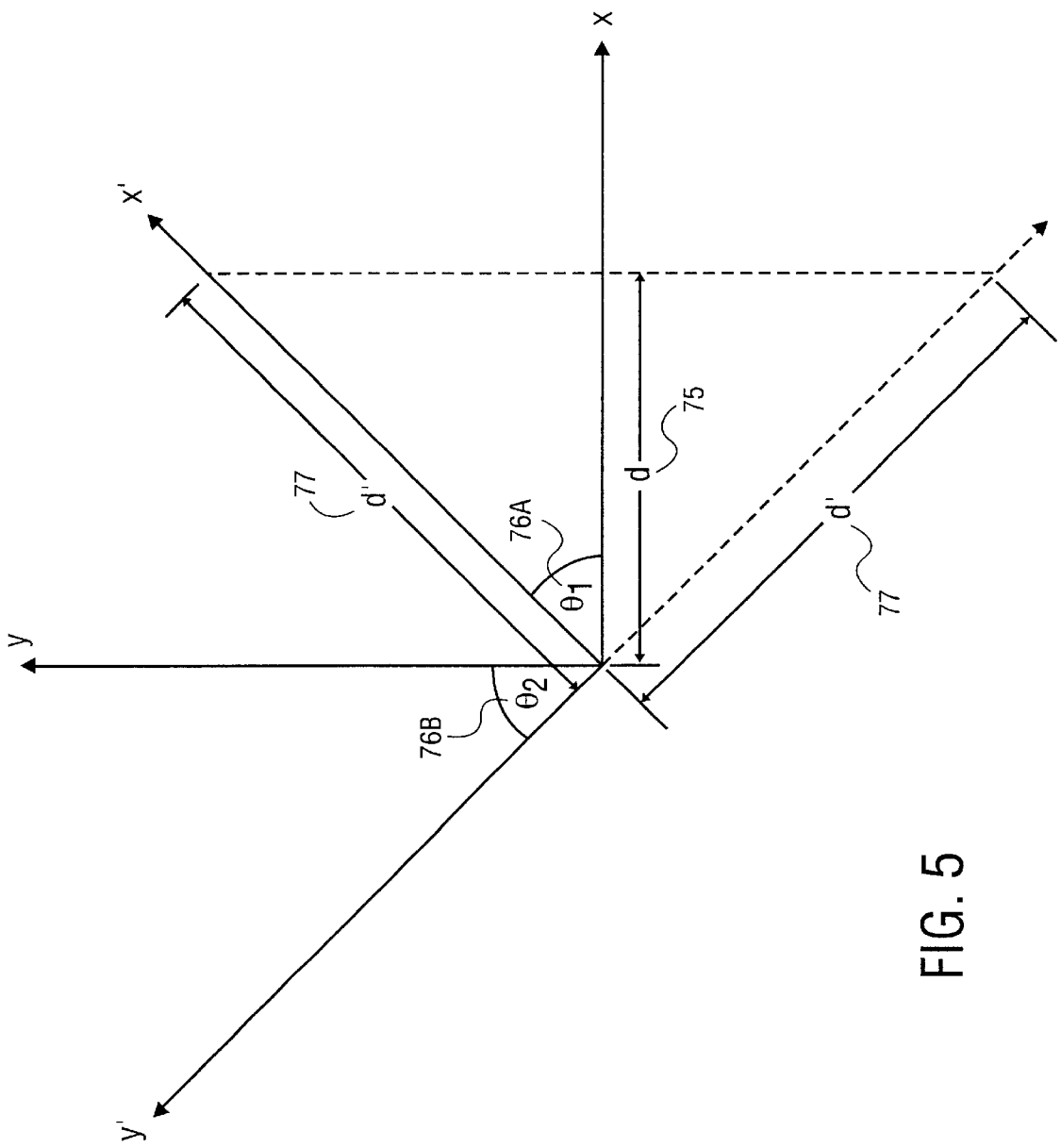
FIG. 5 shows the relationship between two sets of movement axes in accordance with the teachings of the present invention.

FIG. 5 shows the relationship between two sets of movement axes in accordance with the teachings of the present invention. First movement axis (X') and second movement axis (Y') are orthogonal to each other and match the alignment of positioning teeth 58 and 55, respectively. X' and Y' form a set of movement axes that are the physical axes to which the linear motors constrain wafer holding stage 54. A second set of movement axes comprises a third movement axis (X) orthogonal to a fourth movement axis (Y). The distance a wafer disposed on a wafer holding stage is to be moved is measured along either X or Y. X is located by an amount $\theta_1$ (shown as reference angle 76a) from X'; Y is located by an amount $\theta_2$ (shown as reference angle 76b) from Y'. In one embodiment of the present invention, both $\theta_1$ and $\theta_2$ are 45 degrees. X and Y indicate the directions of the path through which wafer holding stage 54 moves as the linear motors of wafer holding stage 54 move it concurrently along X' and Y'. For example, Y is the resultant direction of the path taken by wafer holding stage 54 as positioning teeth 55 and 58 align with lines of positioning teeth 65 on platform 64 along both X' and Y' concurrently. Thus, both the inboard and outboard motors of wafer holding platform 54 work at the same time to create a path of wafer holding platform 54 in either X or Y.

As a further illustration of the effect of the present invention, consider the relationship between d and d' (shown as reference distances 75 and 77, respectively). D represents the distance a wafer on a wafer holding stage is to be moved along X. This distance could be the distance between adjacent dies on a semiconductor wafer; the wafer has a plurality of intersecting rows and columns creating a grid of spaces, and a die is located in each space. To create a resultant path of the wafer through d, the motors on the wafer holding stage must move the wafer holding stage through d' along both physical axes X' and Y' concurrently. As the wafer moves through d along X, probing electrodes located above the wafer and a set of dies on the wafer move relative to each other in only the X direction.

Figure 3A:
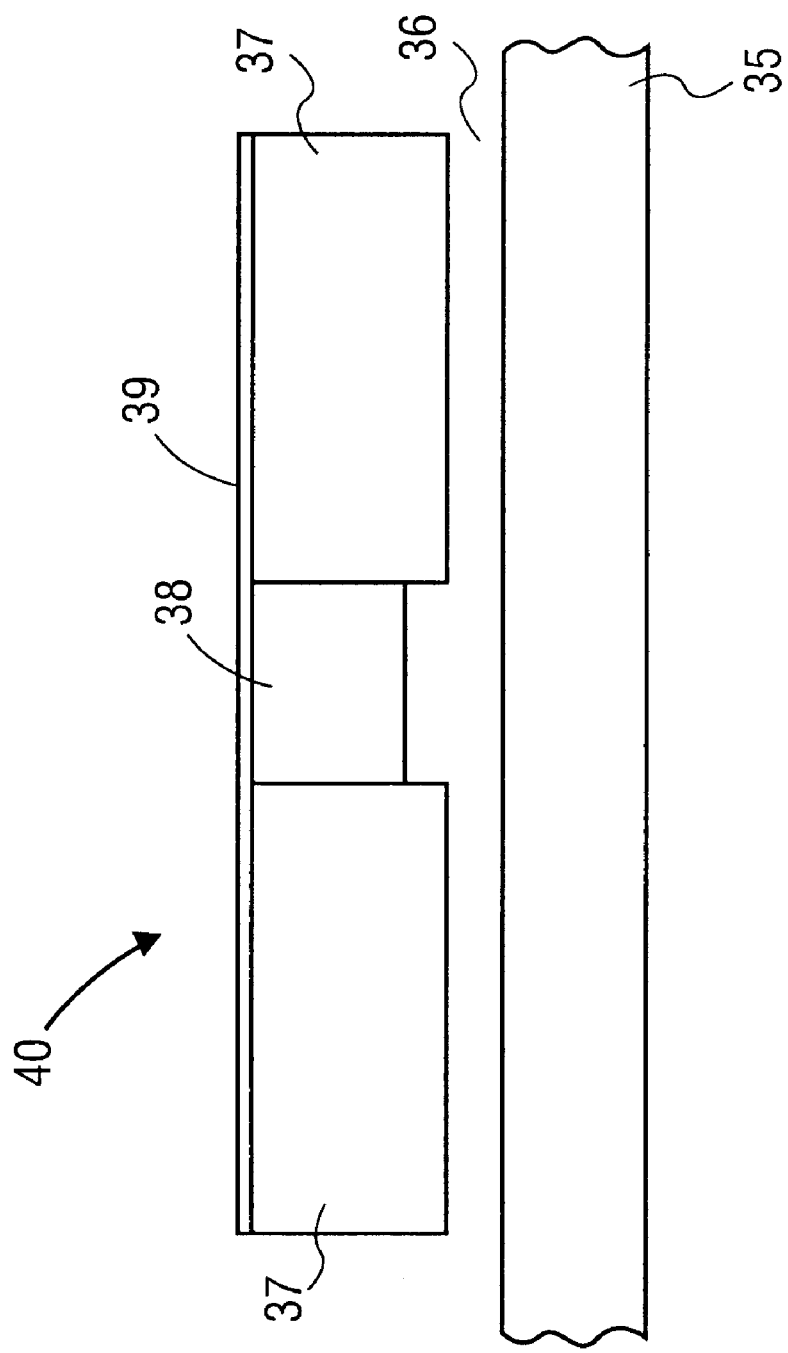
FIG. 3A is a side view of a prior art wafer positioning system.
Figure 3B:
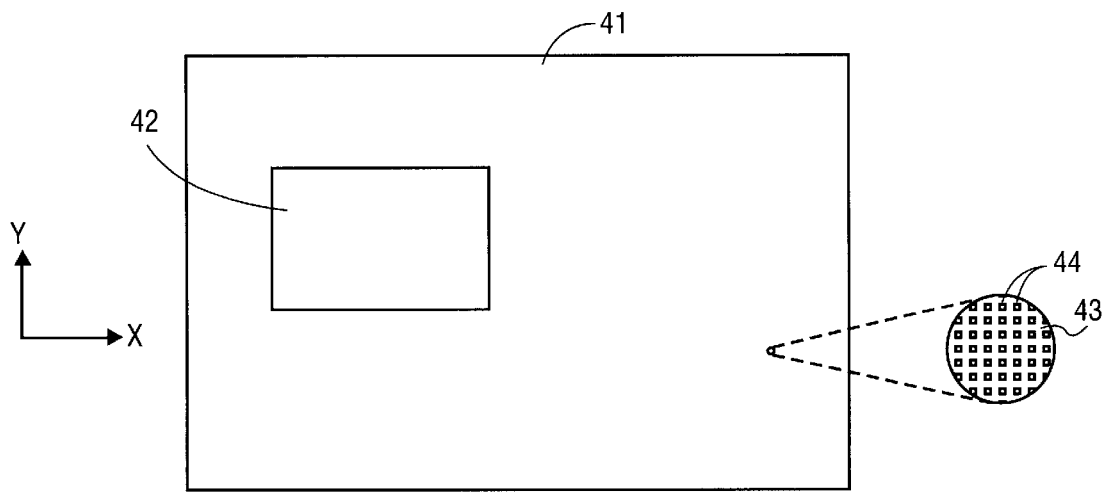
FIG. 3B is a top view of another prior art wafer positioning system.
Figure 3C:
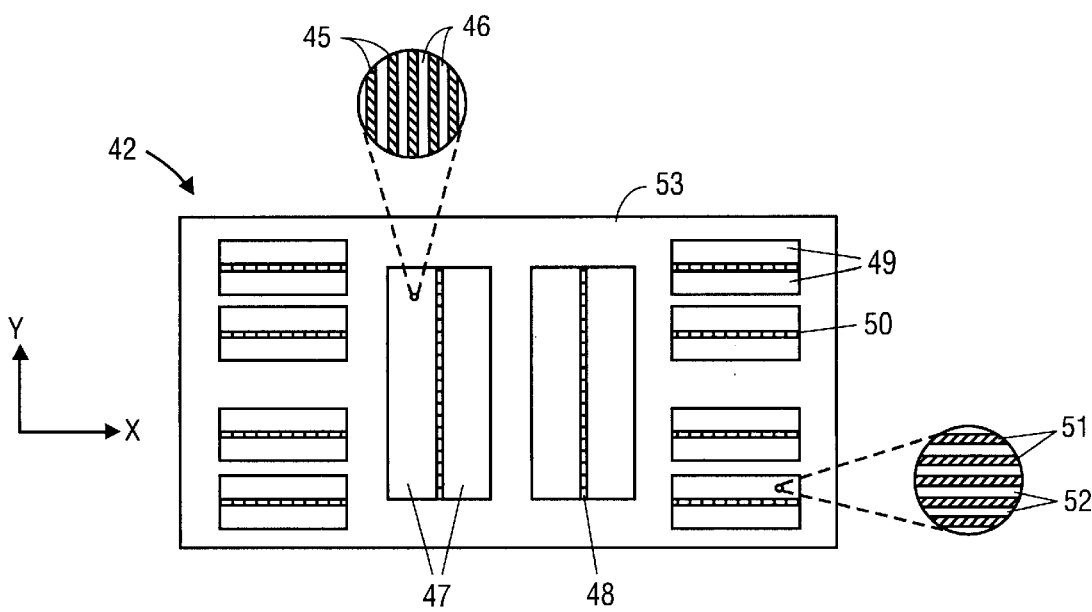
FIG. 3C is a bottom view of a wafer holding stage used in the prior art wafer positioning system shown in FIG. 3B.

In contrast, a prior art wafer holding stage 42 as shown in FIG. 3C has linear motors with positioning teeth 45 and 51 aligned with Y and X, respectively. X and Y indicate both the physical axes to which the linear motors constrain wafer holding stage 54 as well as the directions of the path through which wafer holding stage 54 moves. Thus, to move wafer holding stage 42 through a path along X, only the motors with positioning teeth 45 need to be activated. During the time wafer holding stage 42 Y5 is moving through a path along X, the motors with positioning teeth 51 are not contributing to the movement of wafer holding stage 42.

With reference to FIG. 5, although d' is approximately 1.4 times longer than d if θ is 45 degrees, the fact that two sets of motors are working concurrently to move the wafer holding stage means that there is an overall increase in performance over prior art wafer positioning systems such as the one shown in FIG. 3B. By applying vector analysis to FIG. 5 and assuming equally powerful motors, it is found that the speed of the wafer holding stage should increase by approximately 41%, which would decrease the time needed to test all of the integrated circuits on a semiconductor wafer.

Figure 6A:
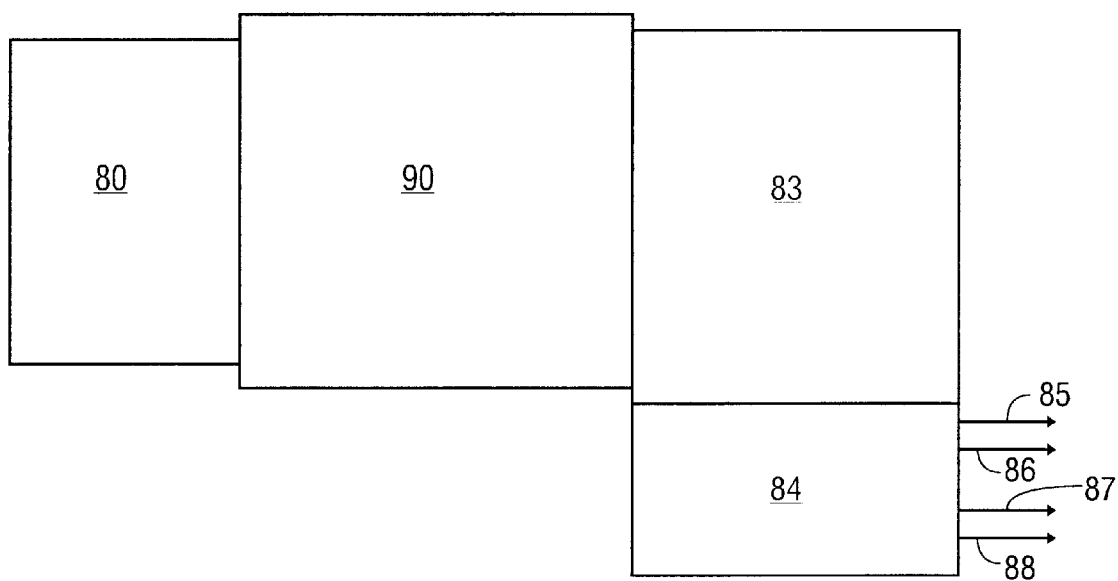
FIGS. 6A and 6B show an example of a motion control system used to control a wafer positioning system in accordance with the teachings of the present invention.
Figure 6B:
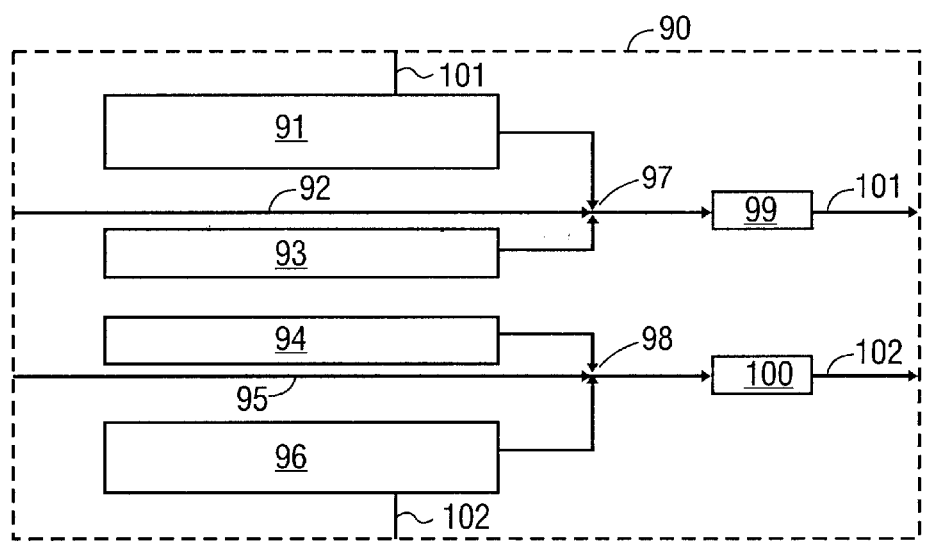

FIG. 6A shows an example of a motion control system that can be used to control a wafer positioning system according to the present invention. FIG. 6B is a simplified representation of the inner workings of one part of the motion control system shown in FIG. 6A. A host control 80 sends the XY coordinates of a new position of a wafer to a position resolver 90 via inputs 92 and 95; it should be noted that in one embodiment both inputs 92 and 95 receive the new XY coordinate pair. The current X position is stored at 91, and the current Y position is stored at 96. At 93 and 94, compensation for movement in X and Y, respectively, is performed by an algorithm that takes into account factors such as temperature and scaling. At 97 and 98, the data from 91–93 and 94–96, respectively, are analyzed to produce the distance needed to move through a path in X and Y, respectively. The required X and Y distances then undergo an angle modification, such as division by cos 45, assuming both $\theta_1$ and $\theta_2$ are 45 degrees, at 99 and 100, respectively. In one embodiment, the angle modification is put into the algorithm performed at 93 and 94. The modified X or Y distance is the distance to be moved in both X' and Y' concurrently to create a path through the original X or Y distances. The modified X and Y distances are sent along outputs 101 and 102, respectively, to a motion control converter 83 which converts the modified distances into a corresponding number of digital signal pulses. A pulse generator 84 then generates the required number of digital signal pulses and sends the pulses corresponding to movement in X' and pulses corresponding to movement in Y' along outputs 85 and 86, and 87 and 88, respectively, to digital-to-analog resolvers (not shown), which activate the motors of a wafer holding stage.

Figure 7A:
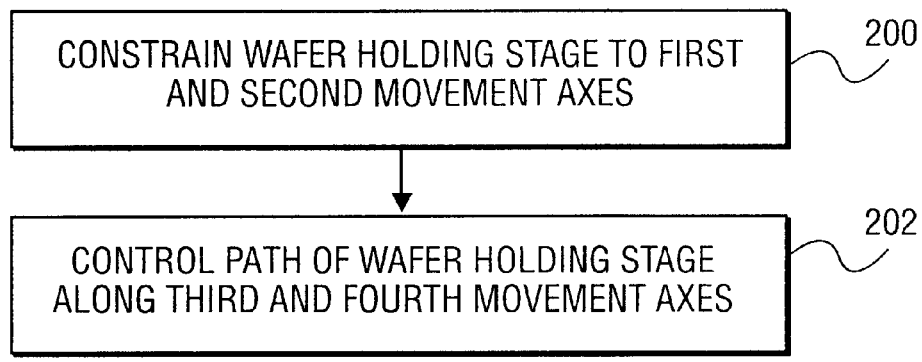
FIGS. 7A and 7B are flowcharts which illustrate various steps of a method in accordance with the teachings of the present invention.
Figure 7B:
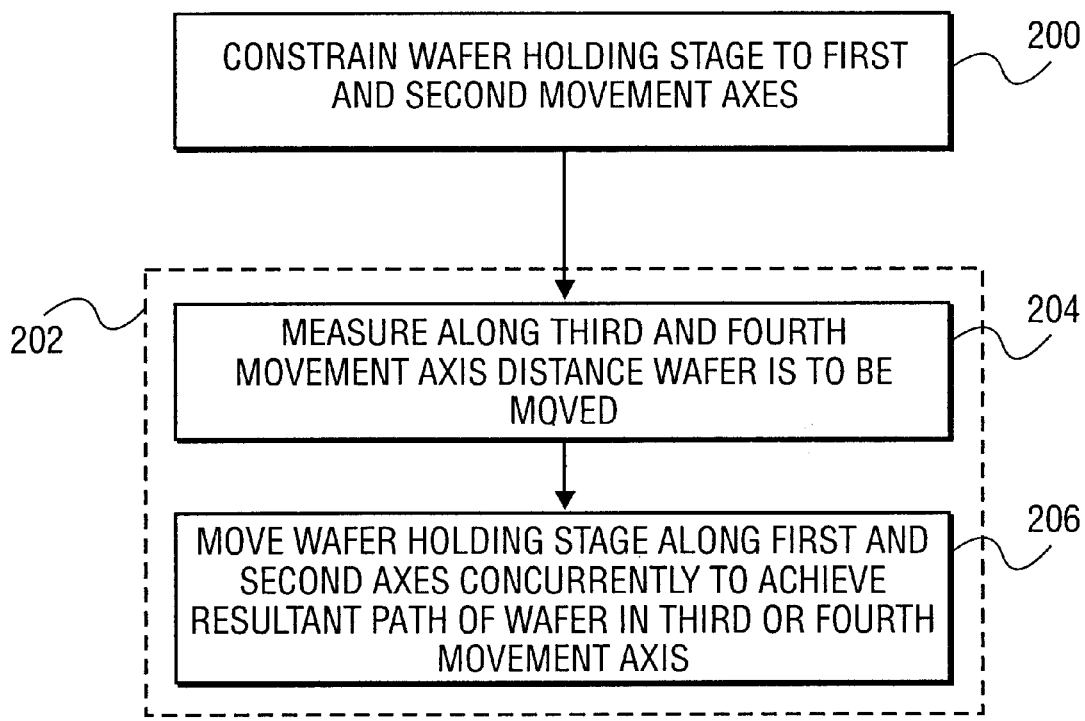

FIGS. 7A and 7B are flowcharts which illustrate various steps of a method according to the present invention. In step 200, a wafer holding stage is constrained to first and second movement axes, which form the physical axes of the wafer positioning system. Generally, the wafer holding stage is constrained by its motor system. In step 202, the path of the wafer holding stage is controlled by a motion control system such that the wafer holding stage moves through third and fourth movement axes, which are located at an angle to the first and second movement axes. As shown in FIG. 7B, step 202 comprises steps 204 and 206. In step 204, the distance a wafer is to be moved is measured along the third and fourth movement axes by the motion control system as described above with reference to FIGS. 6A and 6B. Furthermore, in step 204, the motion control system subtracts the coordinates of a current location of a point on the wafer and a desired location of the point. Finally, in step 206, the motion control system moves the wafer holding stage along the first and second movement axes concurrently by activating all of the motors of the motor system. In one embodiment of the present invention that uses linear motors, the movement of the wafer holding stage occurs through the interaction of electromagnetic and magnetic flux fields between the wafer holding stage and a platform. The movement of the wafer holding stage along the first and second movement axes concurrently results in a path of the wafer along either the third or fourth movement axis.

In the foregoing detailed description, the apparatus and method of the present invention have been described with reference to specific exemplary embodiments. However, it will be evident that various modifications and changes may be made without departing from the broader scope and spirit of the present invention. The present specification and figures are accordingly to be regarded as illustrative rather than restrictive.

What is claimed is:

1. A wafer positioning system comprising:

a motor system to move a wafer holding stage, said wafer holding stage being constrained by said motor system to a first two axes of movement; and a motion control system to control a path of said wafer holding stage along a second two axes of movement;

said first two axes of movement of said motor system comprising a first movement axis disposed at a first angle to a second movement axis, said second two axes of movement of said motion control system comprising a third movement axis disposed at a second angle to a fourth movement axis, said first movement axis being disposed at a third angle to said third movement axis, said second movement axis being disposed at a fourth angle to said fourth movement axis.

2. A wafer positioning system as in claim 1 wherein said motor system comprises said wafer holding stage disposed above a platform, said wafer holding stage having a first side and a second side, a wafer being disposed on said second side, said first side facing said platform.

3. A wafer positioning system as in claim 1 wherein said motion control system comprises a motion control converter coupled to a pulse generator for sending movement signals to said motor system.

4. A wafer positioning system as in claim 1 wherein said motion control system controls said path of said wafer holding stage by moving said wafer holding stage along said first two axes of said motor system concurrently.

5. A wafer positioning system as in claim 1 wherein when movement along only said third movement axis is desired, said motion control system causes said motor system to move said wafer holding stage in both said first and second movement axes concurrently.

6. A wafer positioning system as in claim 1 wherein a wafer is disposed on said wafer holding stage, said wafer comprising a plurality of intersecting rows and columns creating a grid of spaces, each of said spaces having a die, said motion control system causing said motor system to move said wafer holding stage in both said first and second movement axes concurrently such that a set of probing electrodes disposed above said wafer and a set of dies are moved relative to each other in only said third movement axis.

7. A wafer positioning system as in claim 1 wherein a distance a wafer disposed on said wafer holding stage is to be moved is measured along either said third or fourth movement axis.

8. A wafer positioning system as in claim 1 wherein said first angle is approximately equal to said second angle, and said third angle is approximately equal to said fourth angle.

9. A wafer positioning system as in claim 8 wherein said first and second angles are approximately 90 degrees.

10. A wafer positioning system as in claim 8 wherein said third and fourth angles are approximately 45 degrees.

11. A wafer positioning system comprising:
movement means for positioning a wafer holding stage, said wafer holding stage being constrained by said movement means to a first set of movement axes comprising a first and a second movement axis; and
motion control means for controlling a path of said wafer holding stage along a second set of movement axes comprising a third and a fourth movement axis.

12. A wafer positioning system as in claim 11 wherein said movement means comprises:
a wafer holding stage having a first and a second plurality of positioning teeth located on a first side of said wafer holding stage, said wafer being disposed on a second side of said wafer holding stage, said first plurality of positioning teeth being aligned with said first movement axis, said second plurality of positioning teeth being aligned with said second movement axis; and
a platform having a plurality of positioning teeth located on a first side of said platform, said platform being disposed next to said stage such that said first side of said stage faces said first side of said platform, said plurality of positioning teeth being arranged in a waffle pattern to match the alignment of both of said first and second pluralities of positioning teeth of said stage.

13. A wafer positioning system as in claim 11 wherein said motion control means comprises a motion control converter coupled to a pulse generator for sending movement signals to said movement means.

14. A wafer positioning system as in claim 11 wherein said motion control means controls said path of said wafer holding stage by moving said wafer holding stage along said first and second movement axes concurrently.

15. A wafer positioning system as in claim 11 wherein said first movement axis is disposed at a first angle to said second movement axis, said third movement axis is disposed at a second angle to said fourth movement axis, said first movement axis is disposed at a third angle to said third movement axis, and said second movement axis is disposed at a fourth angle to said fourth movement axis.

16. A wafer positioning system as in claim 15 wherein said first angle is approximately equal to said second angle, and said third angle is approximately equal to said fourth angle.

17. A wafer positioning system as in claim 16 wherein said first and second angles are approximately 90 degrees.

18. A wafer positioning system as in claim 16 wherein said third and fourth angles are approximately 45 degrees.

19. A wafer positioning system as in claim 12 wherein said wafer holding stage to comprises:
a first grooved electromagnetic assembly coupled to a second grooved electromagnetic assembly by a first permanent magnet, said first and second grooved electromagnetic assemblies and said first permanent magnet being bonded to said material layer, adjacent grooves of said first and second electromagnetic assemblies being separated by areas comprising said first plurality of positioning teeth; and
a third grooved electromagnetic assembly coupled to a fourth grooved electromagnetic assembly by a second permanent magnet, said third and fourth grooved electromagnetic assemblies and said second permanent magnet being bonded to said material layer, adjacent grooves of said third and fourth electromagnetic assemblies being separated by areas comprising said second plurality of positioning teeth;
said second side of said wafer holding stage comprising a material layer.

20. A wafer positioning system as in claim 19 wherein said material layer is made of aluminum.

21. A wafer positioning system as in claim 12 wherein said wafer holding stage comprises:
a first grooved electromagnetic assembly coupled to a second grooved electromagnetic assembly by a first permanent magnet, said first and second grooved electromagnetic assemblies and said first permanent magnet being bonded to said material layer; and
a third grooved electromagnetic assembly coupled to a fourth grooved electromagnetic assembly by a second permanent magnet, said third and fourth grooved electromagnetic assemblies and said second permanent magnet being bonded to said material layer;
the grooves of said first, second, third and fourth electromagnetic assemblies being filled with epoxy to make said first side of said stage substantially flat, adjacent epoxy-filled grooves of said first and second grooved electromagnetic assemblies being separated by an area comprising said first plurality of positioning teeth, adjacent epoxy-filled grooves of said third and fourth electromagnetic assemblies being separated by an area comprising said second plurality of positioning teeth;
said second side of said wafer holding stage comprising a material layer.

22. A wafer positioning system as in claim 21 wherein said material layer is made of aluminum.

23. A wafer positioning system as in claim 12 wherein adjacent positioning teeth of said waffle pattern are separated by a first distance equal to a second distance separating adjacent positioning teeth of said first and second plurality of positioning teeth of said stage, said first distance being measured along an axis parallel to the orientation of either said first or second plurality of positioning teeth of said stage.

24. A wafer positioning system as in claim 23 wherein said waffle pattern forms a plurality of orthogonally intersecting grooves, said grooves being filled with epoxy to make said first side of said platform substantially flat.

25. A method of moving a wafer holding stage in a wafer positioning system, said method comprising the steps of:

constraining the movement of said wafer holding stage to a first and a second movement axis; and controlling a path of said wafer holding stage along a third and a fourth movement axis;

said first movement axis being disposed at a first angle to said second movement axis, said third movement axis being disposed at a second angle to said fourth movement axis, said first movement axis being disposed at a third angle to said third movement axis, said second movement axis being disposed at a fourth angle to said fourth movement axis.

26. A method as in claim 25 wherein said controlling step comprises the steps of:

measuring along either said third or fourth movement axis a distance a wafer disposed on said wafer holding stage is to be moved; and moving said wafer holding stage along said first and second movement axes concurrently such that said wafer moves through said distance along either said third or fourth movement axis.

27. A method as in claim 26 wherein said measuring step is performed in a two axis coordinate system, and said measuring step comprises the step of subtracting the coordinates of a current location of a point on said wafer and a desired location of said point.

28. A method as in claim 26 wherein said step of moving said wafer holding stage occurs through the interaction of electromagnetic and magnetic flux fields between said wafer holding stage and a platform.

29. A wafer positioning system comprising:

a motor system to move a wafer holding stage, said wafer holding stage being constrained by said motor system to a first coordinate system; and a motion control system to control a path of said wafer holding stage according to a second coordinate system;

said first and second coordinate system being displaced relative to each other.

* * * * *

UNITED STATES PATENT AND TRADEMARK OFFICE
CERTIFICATE OF CORRECTION

PATENT NO.   : 6,389,702 B1
DATED        : May 21, 2002
INVENTOR(S)  : Dudley

It is certified that error appears in the above-identified patent and that said Letters Patent is hereby corrected as shown below:

Column 8,
Line 10, please delete "to".

Signed and Sealed this

Second Day of August, 2005

JON W. DUDAS
*Director of the United States Patent and Trademark Office*